United States Patent [19]
Dornier

[11] Patent Number: 5,504,877
[45] Date of Patent: Apr. 2, 1996

[54] ADAPTIVE DRAM TIMING SET ACCORDING TO SUM OF CAPACITANCE VALVES RETRIEVED FROM TABLE BASED ON MEMORY BANK SIZE

[75] Inventor: Pascal Dornier, Sunnyvale, Calif.

[73] Assignee: Cordata, Inc., Tortoca, Virgin Islands (Br.)

[21] Appl. No.: 346,513

[22] Filed: Nov. 29, 1994

[51] Int. Cl.[6] .................................................. G06F 1/04
[52] U.S. Cl. .......................... 395/550; 395/494; 395/700
[58] Field of Search ...................................... 395/550, 494, 395/700

[56] References Cited

U.S. PATENT DOCUMENTS

| | | | |
|---|---|---|---|
| 3,753,232 | 8/1973 | Sporer | 395/494 |
| 3,974,479 | 8/1976 | Kotok et al. | 395/494 |
| 3,984,812 | 10/1976 | Dahlberg et al. | 395/494 X |
| 4,870,562 | 9/1989 | Kimoto et al. | 395/550 |
| 4,958,304 | 9/1990 | Moore | 395/494 X |
| 5,201,036 | 4/1993 | Yoshimatsu | 395/550 |
| 5,253,357 | 10/1993 | Allen et al. | 395/442 |
| 5,276,856 | 1/1994 | Norsworthy et al. | 395/550 |
| 5,377,325 | 12/1994 | Chan | 395/550 X |
| 5,418,924 | 5/1995 | Dresser | 395/550 X |

*Primary Examiner*—David L. Robertson
*Attorney, Agent, or Firm*—Donald R. Boys

[57] ABSTRACT

Timing is set for DRAM memory access in a computer by polling the DRAM memory banks, calculating capacitive load by accessing a prestored table of capacitive load versus DRAM size, and assigning wait states according to calculated capacitive load by accessing a prestored formula. In one embodiment, wait states are assigned in increasing increments for increasing total capacitive load. In an alternative embodiment, timing is assigned bank by bank. Control routines are preferably a part of a system BIOS.

18 Claims, 3 Drawing Sheets

| A | B |
|---|---|
| 1M | 51pF |
| 2M | 95pF |
| 4M | 51pF |
| 8M | 95pF |
| 16M | 51pF |
| 32M | 95pF |
| 64M | 180pF |

ADAPTIVE DRAM TIMING SET ACCORDING TO SUM OF CAPACITANCE VALVES RETRIEVED FROM TABLE BASED ON MEMORY BANK SIZE

FIELD OF THE INVENTION

This invention is in the area of computer memory systems and pertains in particular to dynamic random access memory (DRAM).

BACKGROUND OF THE INVENTION

The present invention is in the area of DRAM memory systems. DRAM is a very widely used form of memory in computer systems today, and a useful reference for understanding DRAM and potential problems with its use is *Microprocessor Based Design*, by Michael Slater, Copyright 1989 by Prentice-Hall, Inc. Chapter 4, Section 4.7, pages 200–215 is incorporated herein by reference.

As may be seen in more detail in the pages of the reference incorporated above, each DRAM chip in a memory system is an integrated circuit with multiple transistor and capacitor elements that comprise an array of data cells. In operation of DRAM, to prevent data loss through charge leakage from the capacitor elements of the storage structures, data cells must be refreshed (energized) hundreds of times per second.

In a system with DRAM, a microprocessor-based CPU typically manages system operations, initiating read and write cycles to and from ZDRAM, and the CPU of such a system typically operates at a high frequency, the period for which may well be shorter than the cycle time for DRAM operation. The CPU must therefore impose time delays in its read and write operations to allow for delays in reading and writing DRAM. These time delays, called wait states, which are typically set according to programmed information in a system basic input output system (BIOS) at startup, may impose serious limitations on system performance.

The capacitive nature of DRAM has to be considered in a number of ways in system design and development. For example, charging and discharging of the capacitors in DRAM slows transitioning of address and control signals which interface directly with DRAM cells. Also, wiring DRAM chips in parallel increases capacitive load on address and control lines. In addition to these potential difficulties, row and column addresses are often multiplexed in high-performance computer systems to reduce the number of pins required for communication and control, and this circumstance increases the amount of time required to supply a complete memory address.

Many approaches have been taken by hardware and system designers to improve DRAM timing. For example, enhanced addressing and refresh techniques and signal path packaging are incorporated to minimize propagation delays. But these efforts have not completely solved the inherent problems.

In system design, wait states are typically assigned according to worst case expectations. This is a safe approach, since all other situations may be expected to fall within the worst case. In this approach, a system with a relatively light capacitive load may have the same delay restrictions imposed as one with a much larger capacitive load. For example, a 1-megabyte module with 4 chips might be needlessly slowed down by being assigned the same number of wait states as a 16-megabyte module with 36 chips. What is needed is a method to avoid the necessity for worst case assignment, so timing may be set more closely to actual circumstances.

SUMMARY OF THE INVENTION

In a preferred embodiment of the present invention, a method for setting wait states for dynamic random access memory (DRAM) timing in a computer system is provided comprising the steps of: (a) detecting memory size for each DRAM bank; (b) determining capacitive load for each DRAM bank by accessing a pre-stored table relating memory size detected in step (a) to capacitive load; (c) summing total capacitive load for all DRAM memory in system configuration; and (d) assigning wait states for DRAM timing by accessing prestored information relating wait states to be assigned to total capacitive DRAM load. In an alternative embodiment timing is set individually, bank by bank.

In a preferred embodiment, control routines for assigning wait states for DRAM timing are a part of a system BIOS. The ability to detect actual memory size and to relate the memory size to capacitive load, allows timing to be set for individual computers much closer to actual existing conditions, providing optimized computer speed in each case.

DESCRIPTION OF THE PREFERRED EMBODIMENTS

Figure 1:
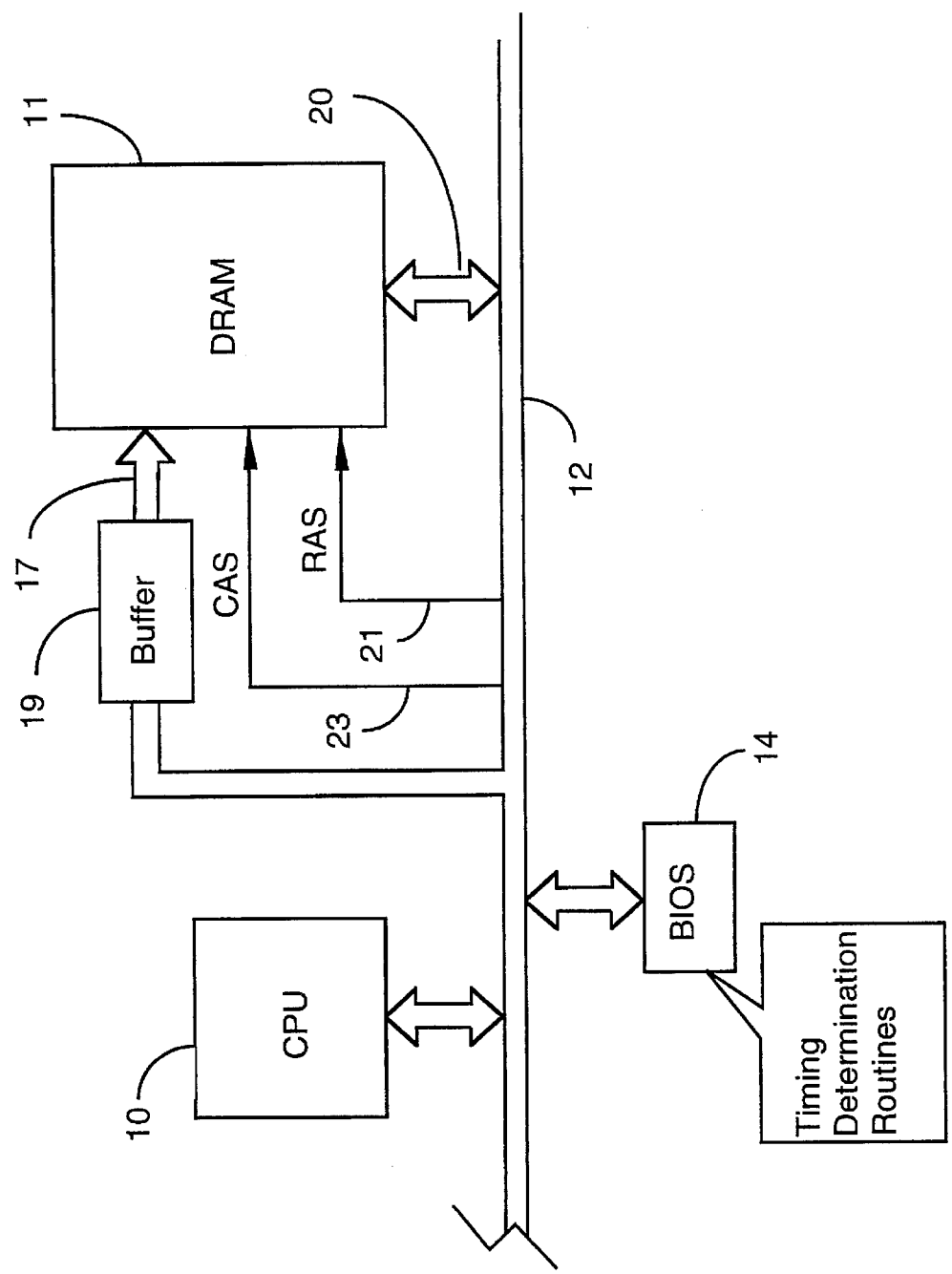
FIG. 1 is a block diagram of a portion of a computer system configured according to a preferred embodiment of the present invention.

FIG. 1 is a quite generalized block diagram of a portion of a computer system including a CPU 10, a system bus 12, a basic input output system (BIOS) 14 including unique timing determination routines according to the present invention, and a DRAM memory array 11. DRAM array 11 includes associated elements, such as refresh interfacing circuitry. DRAM array 11 is meant to represent any number of chips that may comprise a DRAM array.

Memory address (MA) lines 17, a part of system bus 12, run through a buffer 19 that is capable of driving highly capacitive loads to drive the DRAM addresses, and these lines are used to assert both column address and row address at different times, as is well known in the art. Data lines 20 input and output data to and from DRAM array 11.

In FIG. 1, row address strobe (RAS) 21 and column address strobe (CAS) 23 control timing during row and column address inputs and determine delay between memory address input and output. The row address must be stable some time before RAS is asserted, known as setup time, and for some time after RAS is asserted, known as hold time. In addition, setup and hold times for the column address must be met.

Figure 2:
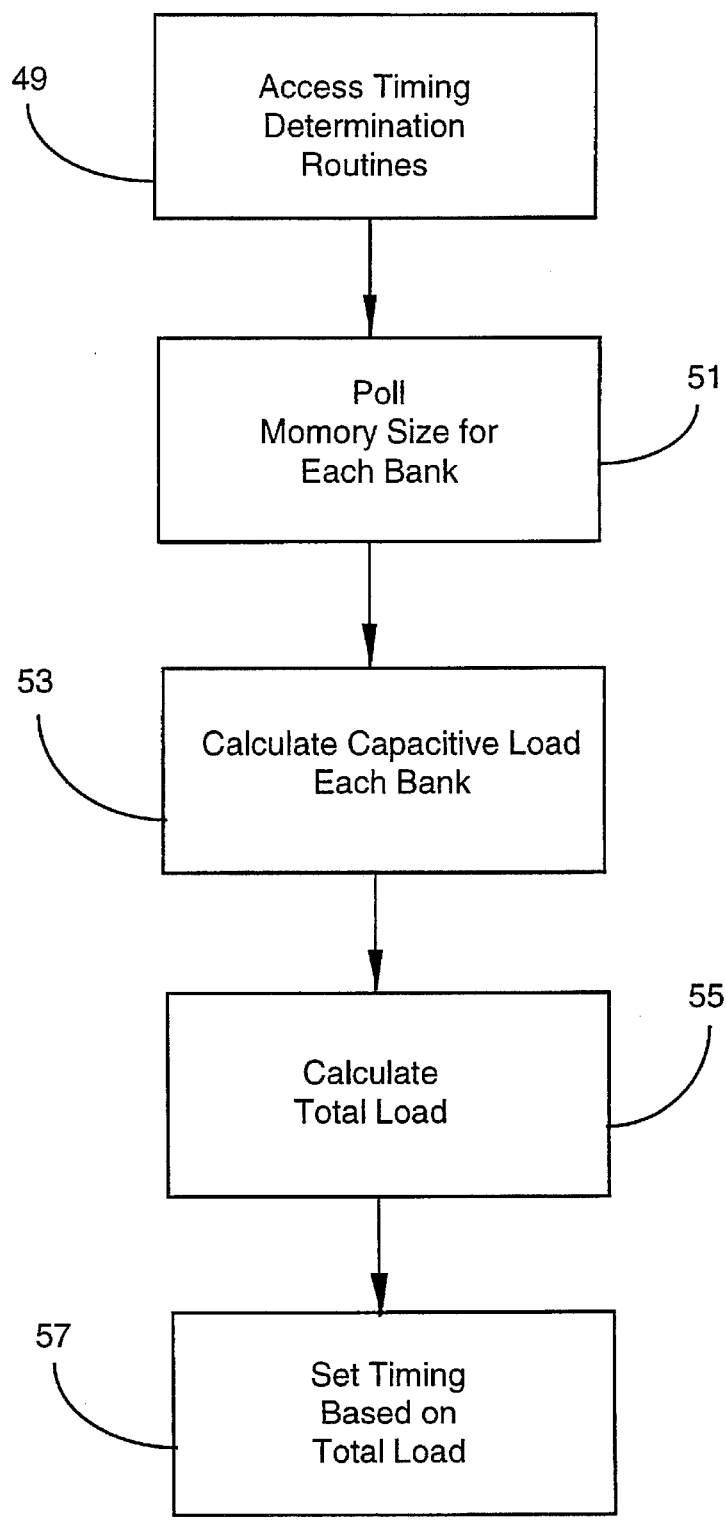
FIG. 2 is a logic flow diagram depicting a process guided by system BIOS to set timing for the embodiment shown in FIG. 1.
Figures 3, 4:
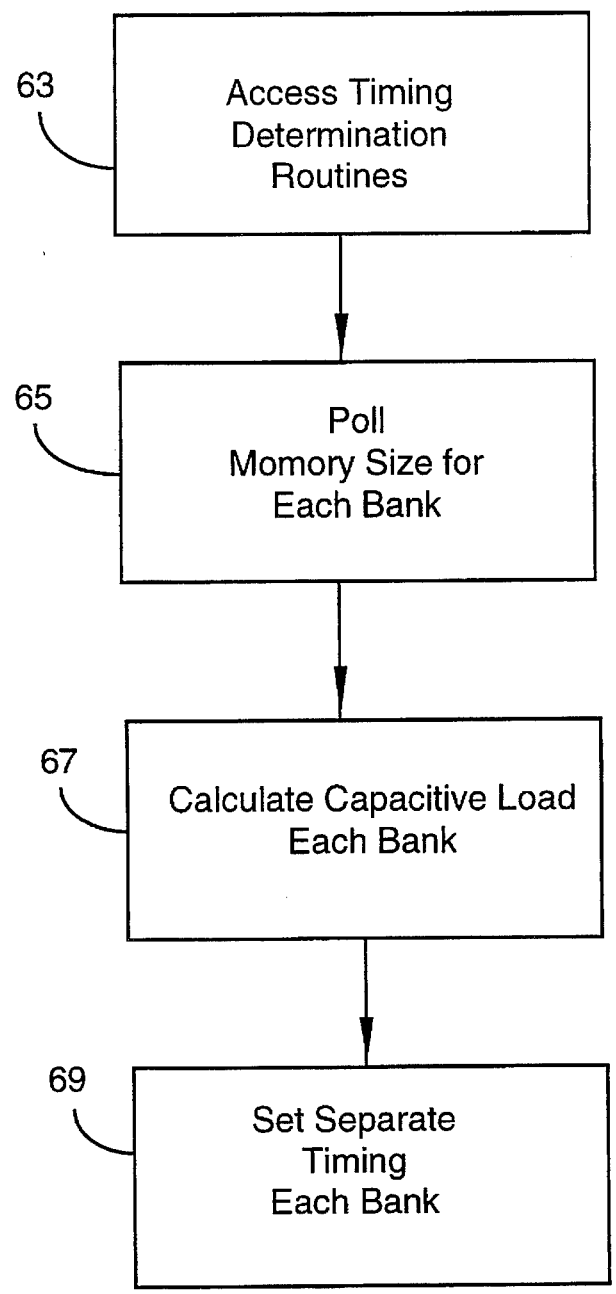
FIG. 3 is an example of a data table used by the process of FIG. 2.
FIG. 4 is a logic flow diagram of a process to set timing according to an alternative embodiment of the present invention.

It is known in the art that delays in addressing increase with the amount of capacitive load in a memory system and, at some point, memory will become unstable unless sufficient hold time is allotted in the form of one or more wait states to accommodate the load induced delay. Such wait states are allotted, typically on startup and reset, usually on a worst-case basis. That is, the firmware that assigns the wait states, typically the system BIOS, may be used in a number of different models and variations of computer systems, and, to be safe, the number of wait states assigned must fit the worst expected case, usually that system or variation with the largest DRAM array. FIG. 2 is a logic flow diagram of a step-by-step process, according to an embodiment of the present invention, wherein timing control routines automatically set wait states according to an anticipated capacitive load that is based on actual memory size of each system configuration rather than for a worst-case basis. FIG. 3 is an exemplary table of DRAM module size correlated with expected capacitive load for each module size.

Step 49—Access Timing Control Routines. Timing control routines, in a preferred embodiment, reside in system BIOS. The BIOS executes the control routines (as well as other BIOS functions) at each startup and reset to set wait states for DRAM timing.

Step 51—Detect Memory Size, Each Bank.

BIOS conventionally polls system random-access memory at startup. The timing control routines access this data for timing determination.

Step 53—Calculate Estimated Load, Each Bank. Timing control routines extract from a data table, such as Table 59 shown in FIG. 3, a capacitive load value for each bank or SIMM in the DRAM configuration. Data table 59 contains two columns: column A lists different memory sizes, in bytes, that might comprise a memory bank or SIMM, and column B lists corresponding expected capacitive loads, in pico-Farads, that are assigned by a designer to best represent each memory size.

Step 55—Calculate Total Load. The timing control routines sum capacitive load, in pico-Farads, for all banks or SIMMS in the DRAM configuration.

Step 57—Set Timing Based on Total Load.

The timing control routines compare the total capacitive load to one or more predefined load thresholds and, based on the load, set timing as a corresponding predefined number of wait states. An example of logic that might be used is given below, where two timing thresholds are used, and variables x and y are low and high threshold limit, respectively:

If load<x, set fast timing (e.g., 0 wait states added).

If x<load<y, set moderate timing (e.g., 1 wait state added).

If load>y, set slow timing (e.g., 2 wait states added).

In variations of the above-described embodiment, more test thresholds might be incorporated in the control logic to more finely tune DRAM timing.

FIG. 4 is a logic flow diagram of a process according to an alternative embodiment of the present invention where DRAM timing is set separately for each bank in a DRAM configuration. This method is described below.

Step 63—Access Timing Control Routines

BIOS executes timing control routines on startup and reset along with conventional BIOS functions.

Step 65—Detect Memory Size, Each Bank.

BIOS conventionally polls system random-access memory at startup. The timing control routines access this data for timing determination.

Step 67—Calculate Load, Each Bank.

From a data table, such as that in FIG. 3, timing control routines extract capacitive load, in pico-Farads, for each bank in the memory configuration.

Step 69—Set Separate Timing, Each Bank.

For each bank, timing control routines compare calculated load to predefined load thresholds and set timing wait states, using the same or similar logic to that described for Step 57 in FIG. 2.

With timing specified individually for each bank as shown in the embodiment described by FIG. 4, individual banks with relatively low total capacitance are assigned relatively fast timing, and timing for banks with higher total capacitance are assigned more wait states.

It will be apparent to one with skill in the art that there are a relatively large number of changes that may be made in the embodiments described above without departing from the spirit and scope of the invention. For instance, load thresholds may vary and bank or SIMM groupings differ. Also, the integration of code in BIOS may vary. Many other alternatives can fall within the scope and spirit of the invention.

What is claimed is:

1. A method for setting wait states for dynamic random access memory (DRAM) timing in a computer system comprising the steps of:

(a) detecting memory size for each DRAM bank;

(b) determining capacitive load for each DRAM bank by accessing pre-stored information relating memory size detected in step (a) to capacitive load;

(c) summing total capacitive load for all DRAM memory in system configuration; and (d) assigning wait states for DRAM timing by accessing prestored information relating wait states to be assigned to total capacitive DRAM load.

2. The method of claim 1 wherein DRAM timing is assigned as X wait states for capacitive load up to and including a first threshold, Y wait states for capacitive between the first threshold and a second threshold, and Z wait states for capacitive load equal to or more than the second threshold, wherein X is less than Y, and Y is less than Z.

3. The method of claim 2 wherein X is zero wait states, Y is 1 wait state, and Z is two wait states.

4. The method of claim 1 wherein the steps are performed as a result of instructions accessed in a basic input output system (BIOS) control routine coupled to the computer system.

5. A computer system comprising:

a microprocessor-based CPU;

a bus communication coupled to the CPU;

a dynamic random access memory (DRAM) system coupled to the communication bus; and a basic input output system (BIOS) connected to the communication bus;

wherein the BIOS is configured to assign DRAM timing in accordance with calculated total DRAM capacitive load based on sensed DRAM memory size.

6. A computer system as in claim 5 wherein the BIOS polls DRAM memory on startup, reset, or command; calculates total capacitive load based on the memory sizes sensed in polling; and assigns wait states for DRAM timing based on the total capacitive DRAM load.

7. A computer system as in claim 6 wherein DRAM timing is assigned as X wait states for capacitive load up to and including a first threshold, Y wait states for capacitive between the first threshold and a second threshold, and Z wait states for capacitive load equal to or more than the second threshold, wherein X is less than Y, and Y is less than Z.

8. A computer system as in claim 7 wherein X is zero wait states, Y is 1 wait state, and Z is two wait states.

9. A basic input output system (BIOS) for a computer, comprising:
   a read-only memory chip; and
   a set of control routines stored at memory addresses in the read-only memory chip;
   wherein the control routines are organized to poll system DRAM memory to detect memory size for each DRAM bank, determine capacitive load for each DRAM bank by accessing pre-stored information relating memory size detected to capacitive load, sum total capacitive load for all DRAM memory detected, and assign wait states for DRAM timing by accessing prestored information relating wait states to be assigned to total capacitive DRAM load.

10. A method for setting wait states for dynamic random access memory (DRAM) timing in a computer system comprising the steps of:
   (a) detecting memory size for each DRAM bank;
   (b) determining capacitive load for each DRAM bank by accessing pre-stored information relating memory size detected in step (a) to capacitive load; and
   (c) assigning wait states for DRAM timing for each DRAM bank individually by accessing prestored information relating wait states to be assigned to capacitive DRAM load for each bank.

11. The method of claim 10 wherein DRAM timing for each DRAM bank is assigned as X wait states for capacitive load up to and including a first threshold, Y wait states for capacitive between the first threshold and a second threshold, and Z wait states for capacitive load equal to or more than the second threshold, wherein X is less than Y, and Y is less than Z.

12. The method of claim 11 wherein X is zero wait states, Y is 1 wait state, and Z is two wait states.

13. The method of claim 10 wherein the steps are performed as a result of instructions accessed in a basic input output system (BIOS) control routine coupled to the computer system.

14. A computer system comprising:
   a microprocessor-based CPU;
   a bus communication coupled to the CPU;
   a dynamic random access memory (DRAM) system coupled to the communication bus; and
   a basic input output system (BIOS) connected to the communication bus;
   wherein the BIOS is configured to assign DRAM timing for each bank in system DRAM in accordance with calculated DRAM capacitive load for each bank based on sensed DRAM memory size.

15. A computer system as in claim 14 wherein the BIOS polls DRAM memory on startup, reset, or command; calculates capacitive load for each bank based on the memory sizes sensed in polling; and assigns wait states for DRAM timing for each bank based on the total capacitive DRAM load.

16. A computer system as in claim 15 wherein DRAM timing for each bank is assigned as X wait states for capacitive load up to and including a first threshold, Y wait states for capacitive between the first threshold and a second threshold, and Z wait states for capacitive load equal to or more than the second threshold, wherein X is less than Y, and Y is less than Z.

17. A computer system as in claim 16 wherein X is zero wait states, Y is 1 wait state, and Z is two wait states.

18. A basic input output system (BIOS) for a computer, comprising:
   a read-only memory chip; and
   a set of control routines stored at memory addresses in the read-only memory chip;
   wherein the control routines are organized to poll system DRAM memory to detect memory size for each DRAM bank, determine capacitive load for each DRAM bank by accessing pre-stored information relating memory size detected to capacitive load, and assign wait states for DRAM timing for each bank by accessing prestored information relating wait states to be assigned to capacitive DRAM load.

* * * * *